United States Patent [19]

Nakayama et al.

[11] Patent Number: 4,935,312
[45] Date of Patent: Jun. 19, 1990

[54] FILM CARRIER HAVING TIN AND INDIUM PLATED LAYERS

[75] Inventors: Hiroshi Nakayama; Keijiro Suzuki; Susumu Miyata, all of Tokyo, Japan

[73] Assignee: Nippon Mining Co., Ltd., Tokyo, Japan

[21] Appl. No.: 282,183

[22] Filed: Dec. 9, 1988

[51] Int. Cl.⁵ .................. B32B 15/02; H05K 1/05
[52] U.S. Cl. ............................ 428/642; 428/646; 428/929; 174/52.4; 439/886
[58] Field of Search ............ 206/328, 330; 174/52.4, 174/68.5, 52.3; 428/642, 646, 647, 936; 439/886, 887, 70

[56] References Cited

U.S. PATENT DOCUMENTS

| | | |
|---|---|---|
| 3,585,010 | 6/1971 | Luce et al. . |
| 3,818,415 | 6/1974 | Evans et al. ............... 439/886 X |
| 3,821,692 | 6/1974 | Barnard ................... 439/887 X |
| 3,857,683 | 12/1974 | Castonguay . |
| 3,908,075 | 9/1975 | Jackson et al. ............ 174/68.5 |
| 3,988,053 | 10/1976 | Dodenhoff ............... 439/886 X |
| 4,010,005 | 3/1977 | Morisaki et al. . |
| 4,255,474 | 3/1981 | Smith, Jr. . |
| 4,511,634 | 4/1985 | Nickol . |
| 4,549,043 | 10/1985 | Kalubowila et al. ........ 428/644 X |
| 4,577,056 | 3/1986 | Butt ..................... 174/52.4 |
| 4,633,050 | 12/1986 | Samuels ................. 428/642 X |
| 4,640,438 | 2/1987 | Trevison et al. ........... 174/52.3 X |
| 4,749,626 | 6/1988 | Kadija et al. . |
| 4,770,923 | 9/1988 | Wasa et al. .............. 206/328 X |
| 4,785,137 | 11/1988 | Samuels ................. 174/255 X |
| 4,808,769 | 2/1989 | Nakano et al. ............ 174/68.5 |
| 4,811,170 | 3/1989 | Pammer . |
| 4,812,421 | 3/1989 | Jung et al. .............. 206/330 X |

FOREIGN PATENT DOCUMENTS

| | | |
|---|---|---|
| 0193127 | 9/1986 | European Pat. Off. . |
| 0281038 | 9/1988 | European Pat. Off. . |
| 52-36529 | 3/1977 | Japan ..................... 204/40 |
| 57-67187 | 4/1982 | Japan ..................... 428/647 |
| 59-05583 | 1/1984 | Japan ..................... 428/642 |
| 59-93898 | 5/1984 | Japan ..................... 204/541 |

OTHER PUBLICATIONS

"Electrical Manufacturing" Magazine, Nov. 1954.

Primary Examiner—Bryon P. Gehman
Attorney, Agent, or Firm—Seidel, Gonda, Lavorgna & Monaco

[57] ABSTRACT

Film carriers for mounting electronic components such as semiconductor chips thereon have lead portions plated with a tin or tin alloy layer and further with an indium layer. The tin or tin alloy layer is 0.1–3 μm thick and the indium layer 0.01–2 μm thick. Alternatively, the leads have a tin or tin alloy plated portion having an indium diffusion layer, with an indium content of 0.2–50 wt %. The carriers are manufactured by a method which comprises plating the leads with tin or a tin alloy and then with indium, with or without heat treatment at 50°–150° C. to form an indium diffusion layer in the tin or tin alloy coating. Plating is done by electroless plating.

11 Claims, 2 Drawing Sheets

FILM CARRIER HAVING TIN AND INDIUM PLATED LAYERS

FIELD OF INVENTION

This invention relates to a film carrier having lead portions suited for packaging semiconductor chips and other electronic components on a printed wiring board, and more specifically to such film carrier which precludes the whisker generation that seriously increases the danger of shorting out the circuits involved, and also relates to a method of manufacturing such carrier.

BACKGROUND OF THE INVENTION

Generally, semiconductor chips such as of IC and LSI are so tiny, each measuring several millimeters square and about 100 microns thick, that they cannot be easily mounted on printed wiring boards. For the facility of mounting, therefore, such chip usually is placed in a certain container known as an IC or LSI package.

The IC or LSI package has a basic form consisted of a chip mounted on a heat sink which is a heatdissipating metallic base, and bonding wires by which electrode terminals of the chip are bonded to leads for connection to external circuits.

The leads, also called pins, project in a centipede-like fashion out of the package.

Predominant among the types of such IC and LSI packages available today are two; the dual-in-line package (DIP) so called because pins in tow rows extend vertically downward from both edges of the container, and the flat package (FP) with pins projecting from the package body in all four directions in the same plane.

The FP type, which can use comparatively more number of leads (pins) than the DIP type, offers the advantage of achieving a somewhat higher packaging density.

The recent tendency toward even higher integration of LSI has involved a proportional, rapid increase in the number of pins used. Neither the FP nor DIP type can catch up with this tendency, and a novel packaging method has been looked for which could cope with the increasing number of pins per package.

It was with this background that a packaging method called the film carrier (or tape carrier) type has been developed.

The film carrier, as illustrated in FIG. 1, comprises a continuous length of tape 2 having two rows of perforations or sprocket holes 1 formed along the both edges. The tape 2 consists of a substrate of a polyimide, polyester, polyether sulfone (PES), polyparabanic acid (PPA) or other resin and a copper foil bonded onto the substrate. Copper inner leads (fingers for chip bonding) 3 and outer leads (fingers for external connections) 4 are formed on the tape by photoetching. Test pads 5 also are formed.

Microscopic patterns including the inner leads 3 and the outer leads 4 are herein collectively called "lead portion."

The manufacture of such a film carrier will now be described in somewhat more detail in conformity with the commonly employed process. A continuous length of polyimide or other resin tape is punched to provide holes for mounting devices, and a copper foil about 35 microns thick as a metal on which circuits are formed is laminated to the tape base. The copper foil is then coated with a resist and is printed with patterns, followed by exposure to light, development, etching, removal of the resist, and finally plating. This sequence of steps produces fine patterns including the lead portions of FIG. 1.

As FIG. 1 shows, leads formed from the copper foil are closely arranged in a high density so as to project partially into each device hole formed by punching a central portion of the base film to mount a semiconductor chip or the like. The individual leads sometimes have a width as narrow as several ten microns.

A semiconductor chip usually are formed with bumps (electrodes) for connection with the inner leads on the film carrier. The bumps of the semiconductor chip and the inner leads on the film carrier are connected by gang bonding method which is a technique for simultaneously interconnecting all of terminals. When the lead portions are to be mounted on a printed wiring board, the copper foil outer leads together with the semiconductor chip are cut off from the film carrier and then packaged on the board (by stamping).

The tape carrier thus fabricated offers many advantages including the following:

(1) Being conveniently handled as a continuous length of tape, it can be accurately positioned with the aid of the sprocket holes.
(2) The inner leads are seldom broken at the time of bonding as compared with those formed by wire bonding. This permits the adoption of a much finer terminal pitch (as small as about 50 microns).
(3) The gang bonding method renders it possible to carry out the bonding in a single step regardless of the number of terminals to be bonded.
(4) Performance tests of the chips are possible as mounted onto the carrier.
(5) A thin, flexible package can be made because the carrier is thin and pliable.
(6) The packaged chip is easy to replace.

With these and other advantages the film carrier is particularly suited for high-density packaged LSI applications that require more pins than heretofore.

The fine patterns of lead portions formed by etching the copper foil laminated to a film base in the manner described above are usually plated with tin or a tin alloy. The tin or tin alloy plating has several purposes of facilitating the bonding to semiconductor chips (bumps), enhancing the bond strength, and improving the solderability of the outer leads.

However, tin or tin alloy plating presents a serious problem in that it readily causes whiskers to grow out of the surface.

Various proposals have so far been made to prevent the whisker generation. Typical of them are:

(1) Heat treatment after tin plating.
(2) Coating with an codeposited alloy of tin with nickel, copper, bismuth, antimony, or other metal.
(3) Addition of a sulfur-containing complexing agent or a certain chelate salt to the plating bath.
(4) Adding a palladium or silver salt or the like to the bath so as to distribute the metal throughout the plated film.
(5) Silver-antimony alloy coating of a tinned surface.
(6) Reduction of hydrogen occlusion in the plated metal to a minimum by inversion of the electrode polarity or by the use of ultrasonic energy during plating.

None of them have, however, proved satisfactory for the prevention of whisker generation on the tin or tin alloy plating of film carriers. The treatment (1) takes long time and has limitations to the treating temperature because, under certain heating conditions, can cause melting or deformation of plastics. The method (2) is questionable in effects and is likely to affect adversely the corrosion resistance and solderability of the plating, with deterioration of electrical properties and other shortcomings. With (3) and (4) adequate effects are not insured. The method (5) is costly and (6) is limited in application and is unable to avoid the generation of whiskers that result from sources other than occluded hydrogen.

The fine-line circuit patterns on a film carrier include extremely densely arranged leads, which form closely spaced, fine projections unsupported by the resin substrate along the center device hole. The generation of whiskers poses a serious problem since it greatly increases the danger of shorting out not merely the circuits but also wiring on the resin. In electronic devices, the tendency is further toward greater density and higher reliability than ever, and this tendency makes it more and more important to solve the problem of whisker generation.

OBJECT OF THE INVENTION

The present invention is aimed at developing a new technique of forming whisker-free tin or tin alloy plating on circuits using narrow-pitch, high-density leads and wires, without presenting the difficulties found in the prior art.

SUMMARY OF THE INVENTION

After intensive research it has now been found that the above aim is effectively achieved by either forming an indium layer over a tin or tin alloy plated layer or forming a tin or tin alloy plating containing an indium diffusion layer.

On the basis of this discovery, the present invention provides (1) a film carrier for mounting electronic components such as semiconductor chips thereon, characterized in that lead portions formed on the carrier have a plated portion consisting of a tin or tin alloy layer and an indium layer formed thereon, and (2) a film carrier for mounting electronic components such as semiconductor chips thereon, characterized in that lead portions formed on the carrier have a tin or tin alloy plated portion having an indium diffusion layer.

For the manufacture of such carriers, the invention also provides (3) a method of manufacturing a film carrier for mounting electronic components such as semiconductor chips thereon, characterized by the steps of plating the lead portions formed on the carrier with tin or a tin alloy and then further plating the tin or tin alloy plated surface with indium, and (4) a method of manufacturing a film carrier for mounting electronic components such as semiconductor chips thereon, characterized by the steps of plating the lead portions formed on the carrier with tin or a tin alloy, further plating the tin or tin alloy plated surface with indium, and then heating the lead portions so as to form a tin or tin alloy plated portion having an indium diffusion layer.

The term "tin alloy" as used herein means any of tin alloys usually used for plating film carriers, with the latent possibility of generating whiskers, and which can be employed for electroless alloy plating, as typified by solder and excluding indium-containing alloys. Tin alloy plating without any potential of whisker generation would leave no room for application of the present invention. Actually, however, it is next to impossible to obtain such general-purpose, whisker-free tin alloy platings.

DETAILED DESCRIPTION OF THE INVENTION

Figure 1:
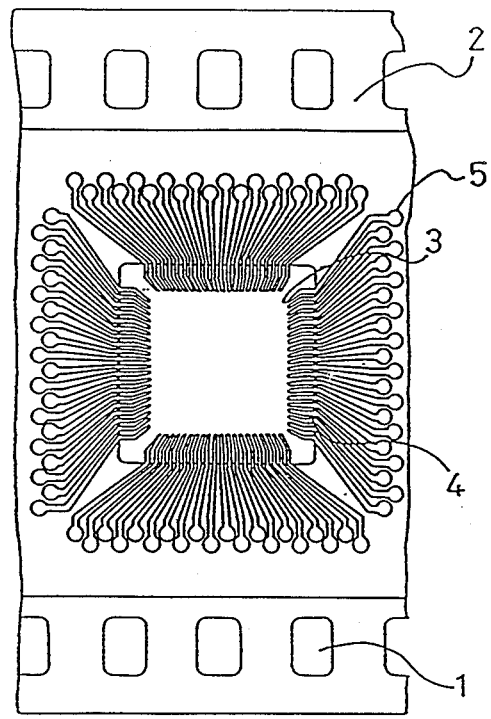
FIG. 1 is a top view of a typical film carrier.

As stated earlier, the manufacture of a film carrier consists in making device holes in a tape of polyimide or other similar resin, laminating a copper foil to the tape base, etching the foil to form fine circuits having lead portions as shown in FIG. 1, and then plating them with tin or a tin alloy. The leads thus formed, discrete and independent of one another, cannot provide electric connections in common. It is therefore practically difficult, if not impossible, to plate them with tin or a tin alloy by electroplating.

In view of this, the present invention depends on the electroless plating method for tin or tin alloy plating.

Electroless tin or tin alloy plating can be performed following a usual plating procedure. Some examples will be given below. It is to be understood that tin or tin alloy plating is not limited to the following examples but may, of course, be carried out differently using other electroless tin or tin alloy plating baths or techniques.

Examples of Electroless Tin Plating

Example 1

| Plating bath | |
|---|---|
| Stannous chloride | 6 g/l |
| Tartaric acid | 39 g/l |
| Thiourea | 55 g/l |
| Operating conditions | |
| Temperature | room temp. |
| Deposition rate | 46.6 mg/20 min |

Example 2

| Plating bath | |
|---|---|
| Stannous chloride | 18.5 g/l |
| Sodium hydroxide | 22.5 g/l |
| Sodium cyanide | 55 g/l |
| Operating conditions | |
| Temperature | 70° C. |
| Deposition rate | 25 mg/20 min |

Example 3

| Plating bath | |
|---|---|
| "Tinposit LT-34" | |
| (a product of Sipley Coo) | |
| Operating conditions | |
| Temperature | 60° C. |
| Time | 10 min |

Tin alloy plating may be performed using a commercially available solder plating solution or the like. Tin alloys with the potential of whisker generation and suited for electroless plating all come within the contemplation of this invention.

Plating with a tin alloy containing 1% or more indium has the possibility of inhibiting whisker growth, but actually electroless plating of an alloy of tin and indium is not effectively carried out. Electroless tin plating is done under acidic or weakly acidic bath conditions whereas electroless indium plating requires alkaline or weakly alkaline conditions.

Next, the tin or tin alloy plated layer thus formed is further subjected to electroless indium plating. An example will be given below, although indium plating is not limited thereto but other electroless indium plating techniques may, of course, be used instead.

Example of Electroless Indium Plating

| Plating bath | |
|---|---|
| Indium sulfate | 2 g/l |
| Sodium nitrilotriacetate | 12 g/l |
| Potassium citrate | 7 g/l |
| Sodium boron hydride | 3 g/l |
| Operating conditions | |
| pH | 10.5 |
| Temperature | 55° C. |
| Time | 48-120 min |

Generally, for the practical purposes the tin or tin alloy layer is desired to range in thickness from 0.1 to 3 $\mu$m. To avoid the generation of whiskers, the indium layer must be from 0.01 to 2 $\mu$m thick according to the thickness of the tin or tin alloy layer. Preferred thickness ranges are between 0.5 and 1 $\mu$m for the tin or tin alloy layer and between 0.025 and 0.5 $\mu$m for the indium layer. More preferably, the indium layer may be made thinner to the range of 0.025 to 0.05 $\mu$m. If the indium layer is less than 0.01 $\mu$m thick it no longer precludes the whisker generation, while on the other hand a thickness beyond 2 $\mu$m is not economically warranted.

The lead portions thus plated with indium is effectively protected against whisker generation.

In a preferred embodiment the present invention involves a heat treatment to form an indium diffusion layer, or a layer of indium diffused in a tin or tin alloy plated layer. Thus, a triple-layer structure consisting of a tin or tin alloy layer, an indium diffusion layer, and an indium layer is formed. Indium may be totally diffused to provide a double-layer structure of a tin or tin alloy plated layer and an indium diffusion layer. In either case the indium diffusion layer even more effectively prevents the generation of whiskers on the tin or tin alloy plating layer.

The heat treatment after indium plating is desirable effected within the temperature range from 50° to 150° C. Since lead portions represent fine-line circuits formed from an about 35 $\mu$m-thick copper foil, heating at elevated temperature tends to soften and deform the lead portions. When this happens, it can lead to deformation or short circuit during the manufacture of a film carrier or during the process of bonding IC or other chips. The heating temperature must, therefore, be lower than 150° C. On the other hand, effective diffusion of indium calls for heating above 50° C. A preferred temperature range for heating is between 100° and 150° C.

Diffusion of a thin indium plating layer into tin or a tin alloy is relatively easy. It can be readily accomplished by immersion into a hot bath at from 70° to 80° C.

Use of hot water is recommended because of its cleaning effect on the plated surface.

Both hot bath and hot water may contain a surface treating agent or agents.

Where plating is followed by some surface treatment, it is possible to use a hot bath containing the surface treating agent to be used so as to effect indium diffusion and surface treatment concurrently.

The indium content is a tin or tin alloy plating which contains an indium diffusion layer generally ranges from 0.2 to 50 percent by weight, particularly from 0.5 to 20 percent by weight, and more particularly from 1 to 10 percent by weight. If the indium content is less than 0.2 percent by weight, it fails to prove effective in avoiding whisker generation. Conversely if it exceeds 50 percent by weight, the tin plating properties undergo such drastic changes that difficulties are involved in the bonding of the film carrier.

The effect of preventing whisker generation in accordance with this invention is really remarkable. By way of demonstrating it, experiments were conducted in which the steps of electroless tin plating, electroless indium plating, and heating for the formation of an indium diffusion layer were followed in a sequence and the results were compared with those of electroless tin plating alone. In the comparative examples of only electroless tin plating too, the same heat treatment as in the preceding examples was performed to eliminate any difference in the influence of heating. Test pieces used for experiments on whisker generation were allowed to stand at 60° C. and 95% RH. The test pieces according to the invention proved by far the more effective in preventing whisker generation than the comparative examples. The results were as summarized in Table 1.

TABLE 1

| Test piece No. | Indium content % | Heat-treatment Temp. °C. | Time min | Whisker growth 1st day | 14th day |
|---|---|---|---|---|---|
| | | | | No. of whiskers/ cm² | |
| Comparative Examples | | | | | |
| 1 | 0 | 70 | 60 | 100-200 | >300 |
| 2 | 0 | 150 | 60 | 5-7 | 170 |
| Examples of the invention | | | | | |
| 3 | 5.0 | 70 | 60 | 0 | 0 |
| 4 | 5.0 | 90 | 60 | 0 | 0 |
| 5 | 10.0 | 120 | 60 | 0 | 0 |
| 6 | 10.0 | 150 | 60 | 0 | 0 |

In order to ensure adequate configuration and dimensional accuracy of the lead portions and achieve good plating efficiency, it is desirable, after the lamination of the copper foil to the film carrier, to form the circuits for leads by etching, coat them by electroless tin alloy plating, perform electroless indium plating, and, where necessary, heat-treating the same so as to form an indium diffusion layer. According to circumstances, it is also possible to carry out the electroless tin or tin alloy plating an electroless indium plating before the etching, with or without subsequent heat treatment.

The invention is illustrated by the following embodiment.

Examples

Figure 2:
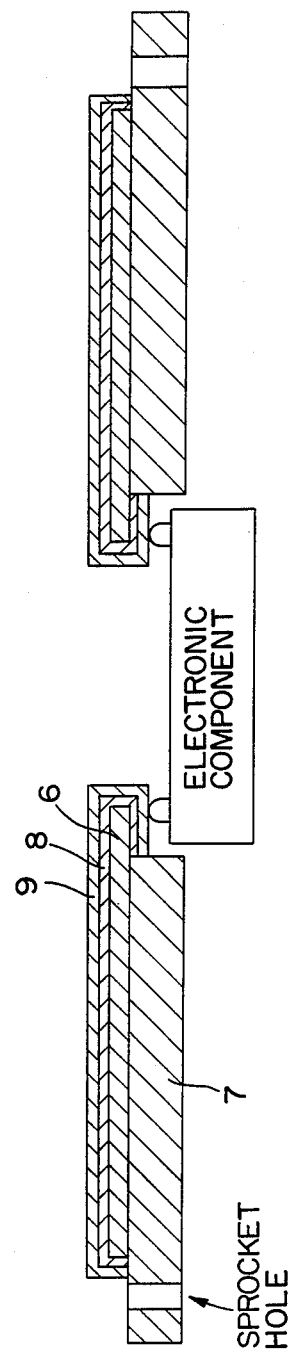
FIG. 2 is a cross-sectional view of a film carrier through a pair of opposite inner leads projecting into a device hole.

Referring now to FIG. 2, a copper foil 6 was laminated to a 35 mm-wide ordinary film of a polyimide 7 as the base and etched to provide a film carrier. This film carrier was tin plated with the above-mentioned electroless tin plating solution "Tinposit LT-34" of Sipley Co. to form a 0.5 μm-thick plating layer 8. Additional plating with indium was done using the indium plating solution and conditions already mentioned to form a 0.025 μm-thick indium layer 9. The plated carrier was kept at 60° C. and 95% RH for one month, but showed no whisker generation.

Part of the test piece was heat-treated by holding in hot water at 70° C. for one hour. The surface plated layer of this specimen was analyzed by the Auger electronic spectroscopy, and it was found that tin and indium had been alloyed. The specimen showed no trace of whisker generation after holding at 60° C. and 95% RH for one month.

ADVANTAGES OF THE INVENTION

The development of film carriers capable of attaining higher packaging density than ever is under way to keep pace with the rapid tendency toward greater degrees of integration and larger numbers of pins of IC, LSI and the like. However, finer dimensions and closer spacing of the leads are posing a serious problem of short circuit owing to whisker generation. The present invention now solves this whisker problem inherent to tin or tin alloy plating, practically without reducing the production efficiency or necessitating cumbersome plating control. It makes possible the manufacture of excellent film carriers to satisfy the future requirements of semiconductor devices and thereby contributes largely to the progress of the art.

What is claimed is:

1. A film carrier for mounting electronic components such as semiconductor chips thereon, having lead portions of an electrically conductive material formed on a base film of said carrier, said lead portions being plated with a tin or tin alloy plated layer, an improvement wherein an indium plated layer is formed on said tin or tin alloy plated layer for preventing the generation of whiskers on said tin or tin alloy plated layer, and wherein said indium plated layer is at least 0.01 μm in thickness.

2. A film carrier according to claim 1 wherein said tin or tin alloy layer ranges in thickness from 0.1 to 3 μm and said indium layer from 0.01 to 2 μm.

3. A film carrier according to claim 2 wherein said indium layer ranges in thickness from 0.025 to 0.5 μm.

4. A film carrier according to claim 3 wherein said indium layer ranges in thickness from 0.025 to 0.05 μm.

5. A film carrier according to claim 1 wherein said tin or tin alloy layer ranges in thickness from 0.5 to 1 μm and said indium layer from 0.025 to 0.5 μm.

6. A film carrier according to claim 5 wherein said indium layer ranges in thickness from 0.025 to 0.05 μm.

7. A film carrier according to claim 1 wherein said tin or tin alloy layer ranges in thickness from 0.1 to 3 μm.

8. A film carrier according to claim 7 wherein said tin or tin alloy layer ranges in thickness from 0.5 to 1 μm.

9. A film carrier according to claim 1 wherein said indium layer ranges in thickness from 0.01 to 2 μm.

10. A film carrier according to claim 9 wherein said indium layer ranges in thickness from 0.025 to 0.5 μm.

11. A film carrier according to claim 10 wherein said indium layer ranges in thickness from 0.025 to 0.05 μm.

* * * * *